United States Patent
Hara et al.

(10) Patent No.: US 9,627,319 B2
(45) Date of Patent: Apr. 18, 2017

(54) SEMICONDUCTOR DEVICE AND SEMICONDUCTOR DEVICE MANUFACTURING METHOD USING PATTERNING AND DRY ETCHING

(71) Applicant: CANON KABUSHIKI KAISHA, Tokyo (JP)

(72) Inventors: Koji Hara, Ichikawa (JP); Nobutaka Ukigaya, Yokohama (JP); Takeshi Aoki, Yokohama (JP); Yasuhiro Kawabata, Kawasaki (JP); Junya Tamaki, Tokyo (JP); Norihiko Nakata, Hiratsuka (JP); Satoshi Ogawa, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/967,815

(22) Filed: Dec. 14, 2015

(65) Prior Publication Data

US 2016/0204068 A1 Jul. 14, 2016

(30) Foreign Application Priority Data

Jan. 8, 2015 (JP) ................................. 2015-002052

(51) Int. Cl.
*H01L 21/3213* (2006.01)
*H01L 23/532* (2006.01)
(Continued)

(52) U.S. Cl.
CPC .. *H01L 23/53223* (2013.01); *H01L 21/02068* (2013.01); *H01L 21/0276* (2013.01);
(Continued)

(58) Field of Classification Search
CPC ........... H01L 21/76832; H01L 2924/00; H01L 21/02068; H01L 21/0276; H01L 21/0332;
(Continued)

(56) References Cited

U.S. PATENT DOCUMENTS

| | | | |
|---|---|---|---|
| 2005/0009323 A1* | 1/2005 | Han | H01L 21/32139 438/636 |
| 2006/0214260 A1* | 9/2006 | Cho | H01L 23/5258 257/529 |
| 2007/0006451 A1* | 1/2007 | Lee | H01L 21/32139 29/825 |

FOREIGN PATENT DOCUMENTS

JP 2001-210648 A 8/2001

* cited by examiner

*Primary Examiner* — Thanh T Nguyen
(74) *Attorney, Agent, or Firm* — Fitzpatrick, Cella, Harper & Scinto

(57) ABSTRACT

A method includes forming a multilayered film including a conductive layer mainly containing aluminum, and a barrier metal layer formed thereon, forming a hard mask layer on the barrier metal layer, patterning a resist on the hard mask layer, patterning the hard mask layer by dry-etching the hard mask layer with the patterned resist as a mask, cleaning a surface of the barrier metal layer with a cleaning solution after the patterning the hard mask layer, and dry-etching the multilayered film with the patterned hard mask layer as a mask after the cleaning the surface of the barrier metal layer. In the patterning the hard mask layer, dry etching is performed with a ratio of a flow rate of an oxidizing gas to a total flow rate of a process gas at less than 1% in a state in which the barrier metal layer is exposed to the process gas.

10 Claims, 8 Drawing Sheets

(51) Int. Cl.
*H01L 21/02* (2006.01)
*H01L 21/027* (2006.01)
*H01L 21/033* (2006.01)
*H01L 21/768* (2006.01)
*H01L 23/528* (2006.01)

(52) U.S. Cl.
CPC .... *H01L 21/0332* (2013.01); *H01L 21/32135* (2013.01); *H01L 21/32139* (2013.01); *H01L 21/76834* (2013.01); *H01L 21/76865* (2013.01); *H01L 21/76885* (2013.01); *H01L 21/76892* (2013.01); *H01L 23/528* (2013.01); *H01L 2924/0002* (2013.01)

(58) Field of Classification Search
CPC ......... H01L 21/32135; H01L 21/32139; H01L 21/76834; H01L 21/76865; H01L 21/76885; H01L 21/76892; H01L 23/528; H01L 23/53223; H01L 2924/0002; H01L 21/02; H01L 21/027; H01L 21/033; H01L 21/3213; H01L 21/768; H01L 23/532
See application file for complete search history.

c>b, a>b

SEMICONDUCTOR DEVICE AND SEMICONDUCTOR DEVICE MANUFACTURING METHOD USING PATTERNING AND DRY ETCHING

BACKGROUND OF THE INVENTION

Field of the Invention

The present invention relates to a semiconductor device including a metal wiring having a multilayered structure, and a semiconductor device manufacturing method.

Description of the Related Art

Conventionally, the line & space of a metal wiring having a multilayered structure using aluminum have been downsized by fine-patterning the metal wiring in a semiconductor device to be used in an LSI or the like. As the method of this fine patterning, a hard mask process which performs dry etching on a multilayered film to be a metal wiring by using a hard mask as a mask is known.

As an inconvenience in this hard mask process, however, a pattern defect which occurs when forming the hard mask poses a problem. This pattern defect occurs when forming the hard mask because a deposit or reaction product is formed in a region where the hard mask is not to be formed. Since these deposit and reaction product disturb etching of the multilayered film as a material to be etched, they cause a wiring short of a metal wiring to be formed. These deposit and reaction product which cause this short are probably formed in a hard mask etching step or in a cleaning step after that.

On the other hand, Japanese Patent Application Laid-Open No. 2001-210648 describes an electronic device manufacturing method including, after a hard mask formation step, a step of cleaning an underlying layer whose uppermost portion is formed by a titanium nitride layer and an exposed portion of the hard mask by using a cleaning solution not containing fluorine. According to Japanese Patent Application Laid-Open No. 2001-210648, the formation of a deposit of a reaction product made of titanium in the titanium nitride layer and fluorine can be suppressed by performing cleaning by using the cleaning solution not containing fluorine.

Japanese Patent Application Laid-Open No. 2001-210648 describes that the reaction product of titanium and fluorine can be reduced, but it makes no mention of other reaction products. More specifically, Japanese Patent Application Laid-Open No. 2001-210648 uses a reaction gas containing oxygen in dry etching of the hard mask, but does not refer to the overetching amount after the titanium nitride layer is exposed. Therefore, there is the possibility that a reaction product of titanium and oxygen forms. Even when this reaction product of titanium and oxygen forms, the reaction product may disturb etching of the multilayered film as the metal wiring, and a wiring short may occur.

SUMMARY OF THE INVENTION

The present invention provides a semiconductor device and semiconductor device manufacturing method capable of implementing fine patterning of a metal wiring and suppressing the occurrence of a wiring short.

To solve the above problem, a semiconductor device manufacturing method according to an aspect of the present invention includes forming a multilayered film including a conductive layer mainly containing aluminum, and a barrier metal layer formed on the conductive layer, forming a hard mask layer on the barrier metal layer, patterning a resist on the hard mask layer, patterning the hard mask layer by dry-etching the hard mask layer by using the patterned resist as a mask, cleaning a surface of the barrier metal layer with a cleaning solution after the patterning the hard mask layer, and dry-etching the multilayered film by using the patterned hard mask layer as a mask after the cleaning the surface of the barrier metal layer, wherein in the patterning the hard mask layer, dry etching is performed by setting a ratio of a flow rate of an oxidizing gas to a total flow rate of a process gas at less than 1% in a state in which the barrier metal layer is exposed to the process gas.

Also, a semiconductor device according to another aspect of the present invention includes a metal wiring including a conductive layer mainly containing aluminum, and a barrier metal layer formed on the conductive layer, and a hard mask layer formed on the barrier metal layer, wherein a width of a lower surface of the hard mask layer is larger than a width of an upper surface of the barrier metal layer, and a width of a lower surface of the barrier metal layer is larger than the width of the upper surface of the barrier metal layer.

The present invention can implement fine patterning of a metal wiring, and suppress the occurrence of a wiring short.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

[First Embodiment]

A semiconductor device and semiconductor device manufacturing method according to a first embodiment of the present invention will be explained with reference to the accompanying drawings. Although a semiconductor device to be explained in each of the first to fifth embodiments is, e.g., a solid-state image sensor, the semiconductor device of the present invention is not limited to a solid-state image sensor, and need only be a semiconductor device including a metal wiring. Note that the overall configuration including a pixel array region and peripheral region of a solid-state image sensor as an example of the semiconductor device of the present invention will be described later.

Figure 1:
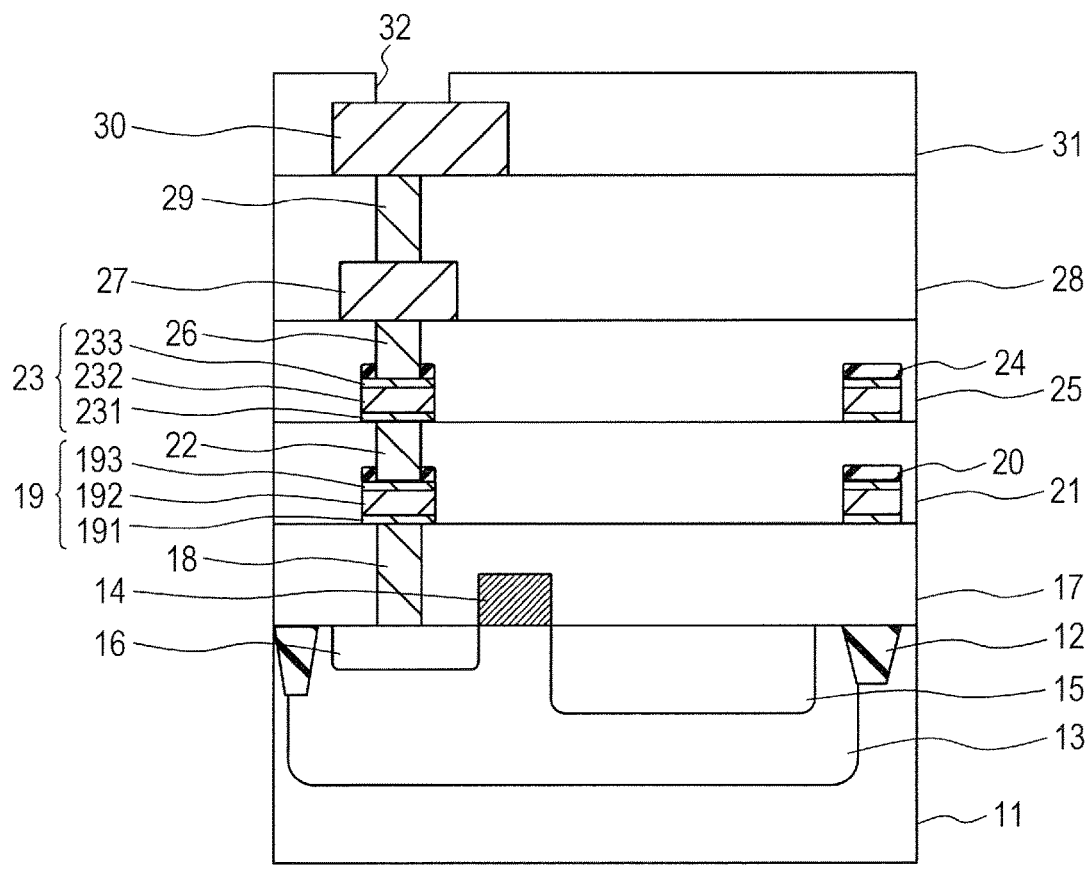
FIG. 1 is a schematic sectional view showing a semiconductor device according to a first embodiment of the present invention.
Figure 2:
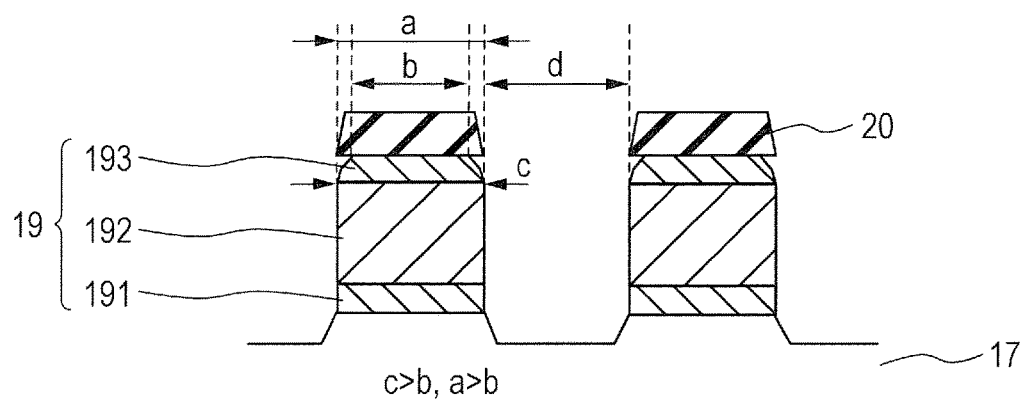
FIG. 2 is a schematic sectional view showing a metal wiring in the semiconductor device according to the first embodiment of the present invention.

First, the sectional arrangement of the semiconductor device according to the present embodiment will be explained with reference to FIGS. 1 and 2. FIG. 1 is a schematic sectional view showing the semiconductor device according to the present embodiment. FIG. 2 is a schematic sectional view showing a metal wiring in the semiconductor device according to the present embodiment.

As shown in FIG. 1, an element isolation portion 12 made of an insulator such as STI or LOCOS and defining an element region is formed in, e.g., a silicon substrate 11 as a semiconductor substrate. A well diffusion layer 13 is formed in the silicon substrate 11 of the element region.

A gate electrode 14 is formed on a gate insulating film on the region of the silicon substrate 11 where the well diffusion layer 13 is formed. The gate electrode 14 is, e.g., a polysilicon gate made of polysilicon. Also, in the well diffusion layer 13 on the two sides of the gate electrode 14, a photodiode diffusion layer 15 forming a photodiode and a source/drain diffusion layer 16 are formed.

An interlayer insulating layer 17 is formed on the silicon substrate 11. A contact hole reaching the source/drain diffusion layer 16 is formed in the interlayer insulating layer 17, and a contact plug 18 electrically connected to the source/drain diffusion layer 16 is buried in this contact hole.

A first metal wiring 19 is formed on the interlayer insulating layer 17. The first metal wiring 19 has a multilayered structure, and is formed by, e.g., a multilayered film obtained by sequentially stacking a barrier metal layer 191, a conductive layer 192, and a barrier metal layer 193. The barrier metal layer 191 is formed by, e.g., a multilayered film obtained by sequentially stacking a titanium layer and a titanium nitride layer. The conductive layer 192 mainly contains aluminum, and is formed by, e.g., an aluminum layer or an aluminum alloy layer such as an AlCu alloy layer. The barrier metal layer 193 on the conductive layer 192 is formed by, e.g., a multilayered film obtained by sequentially stacking a titanium layer and a titanium nitride layer. Note that each of the barrier metal layers 191 and 193 may also be formed by a titanium nitride layer without any titanium layer. The barrier metal layers 191 and 193 suppress the material of the conductive layer 192 formed by an aluminum layer or aluminum alloy layer from diffusing to surrounding members such as the contact plug 18 and a via plug 22.

The first metal wiring 19 is electrically connected to the source/drain diffusion layer 16 via the contact plug 18. A hard mask layer 20 as an insulating layer which functions as a hard mask is formed on the barrier metal layer 193 of the first metal wiring 19. Note that as will be described later, the hard mask layer 20 on the barrier metal layer 193 was used as a hard mask in dry etching for patterning the first metal wiring 19.

An interlayer insulating layer 21 is formed on the interlayer insulating layer 17 on which the first metal wiring 19 is formed. A through hole reaching the first metal wiring 19 is formed in the interlayer insulating layer 21 and hard mask layer 20, and the via plug 22 electrically connected to the first metal wiring 19 is buried in this through hole.

A second metal wiring 23 is formed on the interlayer insulating layer 21. The second metal wiring 23 has a multilayered structure, and is formed by, e.g., a multilayered film obtained by sequentially stacking a barrier metal layer 231, a conductive layer 232, and a barrier metal layer 233. The barrier metal layer 231 is formed by, e.g., a multilayered film obtained by sequentially stacking a titanium layer and a titanium nitride layer. The conductive layer 232 mainly contains aluminum, and is formed by, e.g., an aluminum layer or an aluminum alloy layer such as an AlCu alloy layer. The barrier metal layer 233 on the conductive layer 232 is formed by, e.g., a multilayered film obtained by sequentially stacking a titanium layer and a titanium nitride layer. Note that each of the barrier metal layers 231 and 233 may also be formed by a titanium nitride layer without any titanium layer. The barrier metal layers 231 and 233 suppress the material of the conductive layer 232 formed by an aluminum layer or aluminum alloy layer from diffusing to surrounding members such as the via plug 22 and a via plug 26.

The second metal wiring 23 is electrically connected to the first metal wiring 19 via the via plug 22. A hard mask layer 24 as an insulating layer which functions as a hard mask is formed on the barrier metal layer 233 of the second metal wiring 23. Note that as will be described later, the hard mask layer 24 on the barrier metal layer 233 is used as a hard mask in dry etching for patterning the second metal wiring 23.

An interlayer insulating layer 25 is formed on the interlayer insulating layer 21 on which the second metal wiring 23 is formed. A through hole reaching the second metal wiring 23 is formed in the interlayer insulating layer 25 and hard mask layer 24, and the via plug 26 electrically connected to the second metal wiring 23 is buried in this through hole.

A third metal wiring 27 is formed on the interlayer insulating layer 25. The third metal wiring 27 is formed by an aluminum layer or an aluminum alloy layer such as an AlCu alloy layer. Note that like the first and second metal wirings 19 and 23, the third metal wiring 27 may also be formed by a multilayered film including a barrier metal layer. The third metal wiring 27 is electrically connected to the second metal wiring 23 via the via plug 26.

An interlayer insulating layer 28 is formed on the interlayer insulating layer 25 on which the third metal wiring 27 is formed. A through hole reaching the third metal wiring 27 is formed in the interlayer insulating layer 28, and a via plug 29 electrically connected to the third metal wiring 27 is buried in this through hole.

A fourth metal wiring 30 including a bonding pad is formed on the interlayer insulating layer 28. The fourth metal wiring 30 is formed by an aluminum layer or an aluminum alloy layer such as an AlCu alloy layer. Note that like the first and second metal wirings 19 and 23, the fourth metal wiring 30 may also be formed by a multilayered film including a barrier metal layer. The fourth metal wiring 30 is electrically connected to the third metal wiring 27 via the via plug 29.

A protective insulating film 31 is formed on the interlayer insulating layer 28 on which the fourth metal wiring 30 is formed. An opening 32 reaching the bonding pad of the fourth metal wiring 30 is formed in the protective insulating film 31. The protective insulating film 31 is made of silicon nitride or the like.

Note that an insulating layer such as a BPSG (Boro-Phospho Silicate Glass) layer or an silicon oxide layer can be used as the interlayer insulating layer 17, hard mask layers 20 and 24, and interlayer insulating layers 21, 25, and 28. Note also that an insulating film including one or more of, e.g., a silicon nitride layer, silicon oxynitride layer, and silicon oxide layer can be used as the protective insulating film 31.

A specific structure of the metal wiring in the semiconductor device according to the present embodiment will now be explained with reference to FIG. 2. FIG. 2 is a schematic sectional view showing the metal wiring in the semiconductor device according to the present embodiment. More specifically, FIG. 2 shows the sectional structure of the first metal wiring 19.

As shown in FIG. 2, the first metal wiring 19 formed on the interlayer insulating layer 17 includes the barrier metal layer 191, the conductive layer 192 formed on the barrier metal layer 191, and the barrier metal layer 193 formed on the conductive layer 192. In addition, the hard mask layer 20 is formed on the barrier metal layer 193 of the first metal wiring 19.

At least the upper portion of the barrier metal layer 193 on the upper side of the first metal wiring 19 has a tapered shape which gradually widens from the upper surface toward the lower surface. Also, at least the upper portion of the hard mask layer 20 on the barrier metal layer 193 has a tapered shape which gradually widens from the upper surface toward the lower surface.

Let a (nm) be the width of the lower surface of the hard mask layer 20, b (nm) be the width of the upper surface of the barrier metal layer 193, and c (nm) be the width of the lower surface of the barrier metal layer 193. The hard mask layer 20 and barrier metal layer 193 have a structural feature that the widths a, b, and c satisfy the following relationship:

$$a > b \text{ and } c > b$$

That is, the width a of the lower surface of the hard mask layer 20 is larger than the width b of the upper surface of the barrier metal layer 193. Furthermore, the width c of the lower surface of the barrier metal layer 193 is larger than the width b of the upper surface of the barrier metal layer 193.

The above-mentioned structural feature shown in FIG. 2 occurs during wet etching after dry etching for patterning the hard mask layer 20. That is, this structural feature occurs because the upper portion of the barrier metal layer 193 exposed by removing the hard mask layer 20 is partially removed by wet etching, and the barrier metal layer 193 is side-etched. As will be described later, when the upper portion of the barrier metal layer 193 is partially removed, it is possible to efficiently remove foreign substances including a reaction product and etching residue, and improve the yield of a wiring step.

Note that FIG. 2 shows the sectional structure of the first metal wiring 19, but the second metal wiring 23 also has the same structural feature as that of the first metal wiring 19 with respect to the hard mask layer 24 and barrier metal layer 233.

Figure 4A:
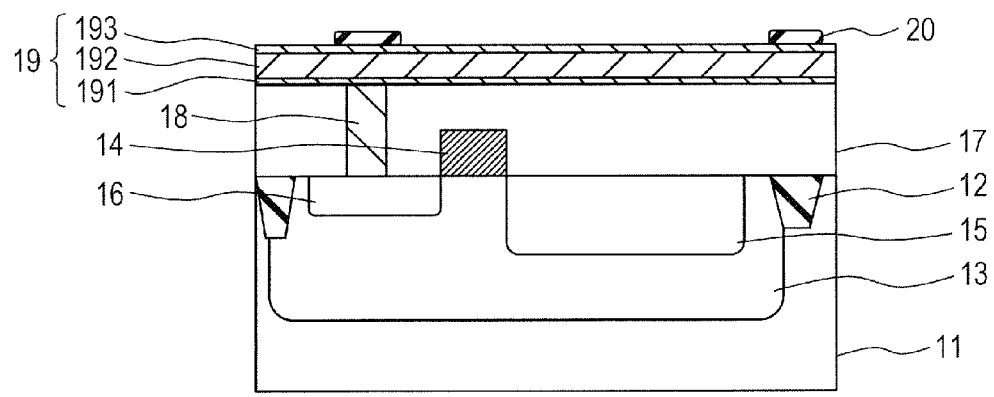
Figure 4B:
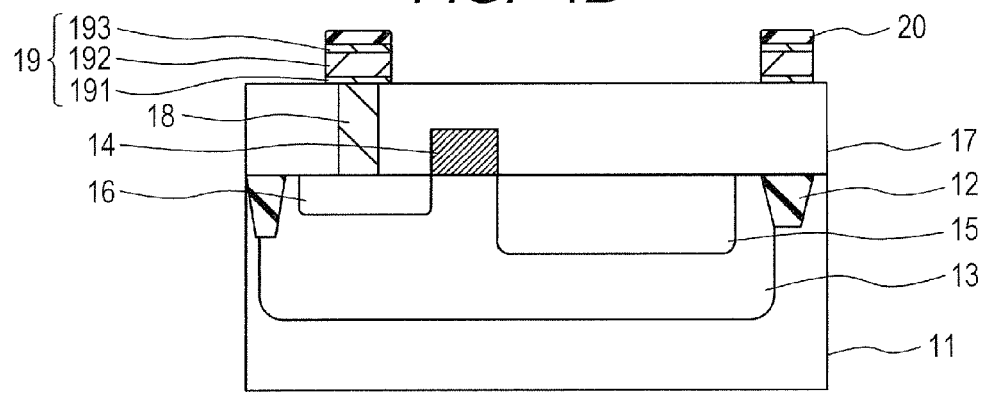
Figure 4C:
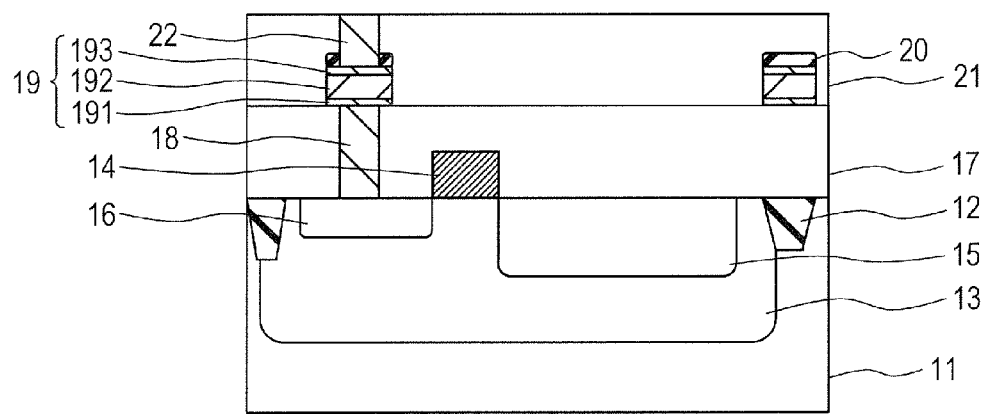
Figure 5A:
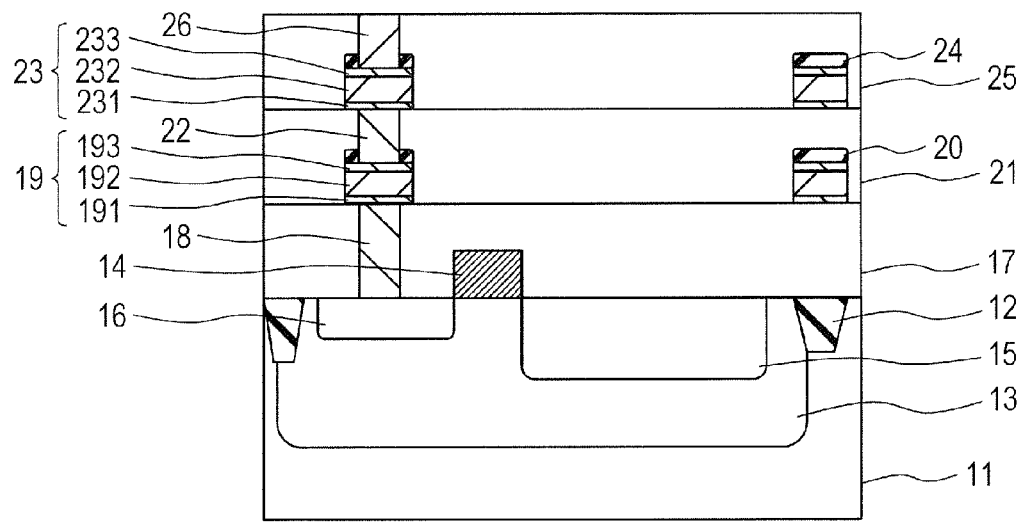

Next, a semiconductor device manufacturing method according to the present embodiment will be explained with reference to FIGS. 3A to 3C, 4A to 4C, 5A, 5B, and 6. FIGS. 3A to 3C, 4A to 4C, 5A, and 5B are sectional views showing the steps of the semiconductor device manufacturing method according to the present embodiment. FIG. 6 is a flowchart showing a first metal wiring formation step in the semiconductor device manufacturing method according to the present embodiment.

Note that in the following explanation, major parts of a metal wiring manufacturing method will mainly be explained for the sake of simplicity, and undescribed portions will be formed by a conventional solid-state image sensor manufacturing method.

Figure 3A:
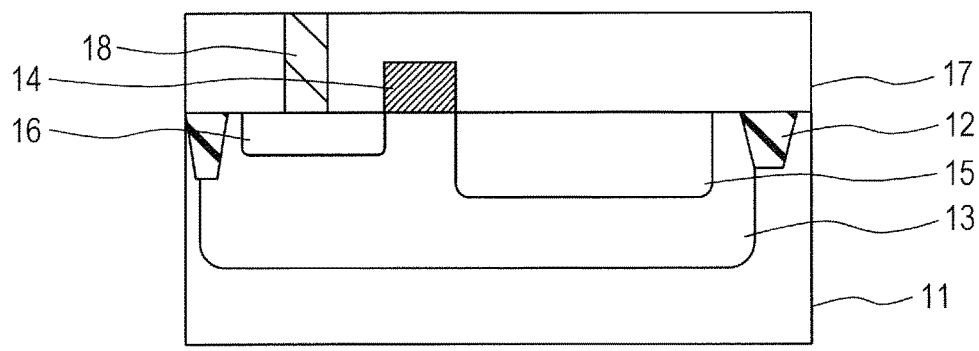
FIGS. 3A, 3B, 3C, 4A, 4B, 4C, 5A, and 5B are sectional views showing the steps of a semiconductor device manufacturing method according to the first embodiment of the present invention.

First, as shown in FIG. 3A, an element isolation portion 12 is formed in a silicon substrate 11, and an element region is defined by the element isolation portion 12. Also, a well diffusion layer 13 is formed in the silicon substrate 11 of the element region. Then, a gate electrode 14 is formed on a gate insulating layer on the silicon substrate 11 in which the well diffusion layer 13 is formed. In addition, a photodiode diffusion layer 15 and source/drain diffusion layer 16 are formed in the well diffusion layer 13 on the two sides of the gate electrode 14. Subsequently, an interlayer insulating layer 17 is formed on the silicon substrate 11. A contact hole reaching the source/drain diffusion layer 16 is formed in the interlayer insulating layer 17, and a contact plug 18 is buried in this contact hole. Note that these parts shown in FIG. 3A can be formed by using a general semiconductor device manufacturing process.

A step of forming a first metal wiring 19 as the next step will be explained in detail below. The explanation will be made by additionally referring to FIG. 6.

First, a titanium layer having a thickness of, e.g., about 10 nm and a titanium nitride layer having a thickness of, e.g., about 20 nm are sequentially deposited on the interlayer insulating layer 17 by sputtering or the like, thereby forming a barrier metal layer 191 in which the titanium layer and titanium nitride layer are sequentially stacked.

Then, an aluminum alloy layer made of, e.g., AlCu containing about 0.5 wt % of Cu and having a thickness of about 230 nm is deposited on the barrier metal layer 191 at a deposition temperature of about 300° C. by sputtering or the like, thereby forming a conductive layer 192 by this aluminum alloy layer.

Subsequently, a titanium layer having a thickness of, e.g., about 3 nm and a titanium nitride layer having a thickness of, e.g., about 30 nm are sequentially deposited on the conductive layer 192 by sputtering or the like, thereby forming a barrier metal layer 193 in which the titanium layer and titanium nitride layer are sequentially stacked.

Thus, a multilayered film which includes the barrier metal layer 191, the conductive layer 192, and the barrier metal layer 193 to be processed into a first metal wiring 19 is formed on the interlayer insulating layer 17 (FIG. 6: step S11).

Then, a hard mask layer 20 made of a silicon oxide layer having a thickness of, e.g., about 100 to 200 nm is formed on the barrier metal layer 193 by, e.g., plasma CVD (Chemical Vapor Deposition) (FIG. 6: step S12). This silicon oxide layer forming the hard mask layer 20 can be formed by, e.g., causing TEOS (TetraEthyl OrthoSilicate, $Si(OC_2H_5)_4$) and $O_2$ to react with each other in a plasma state at a deposition temperature of about 300 to 400° C.

Figure 3B:
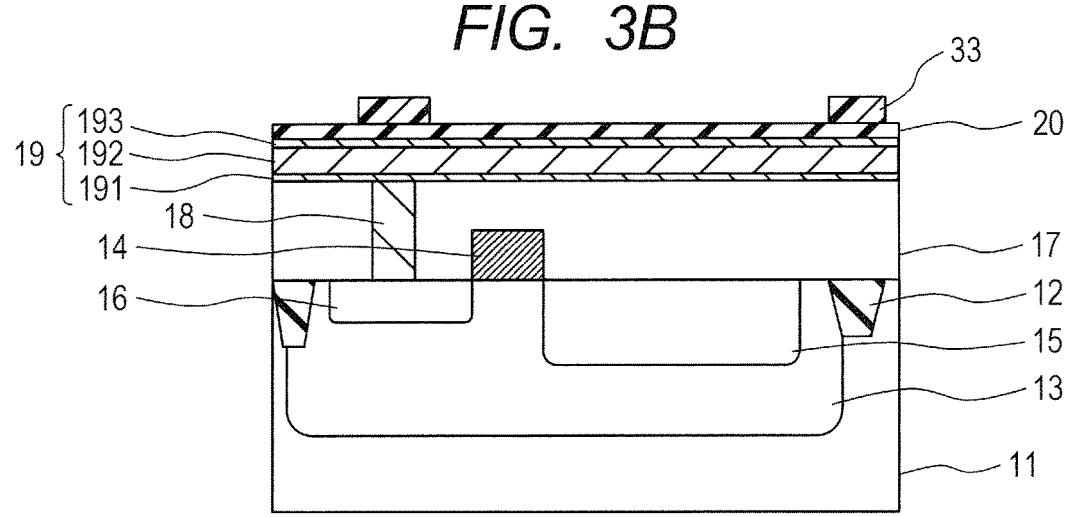

Subsequently, as shown in FIG. 3B, a mask pattern of a resist 33 is formed on the hard mask layer 20 by patterning the resist 33 by photolithography (FIG. 6: step S13).

Figure 3C:
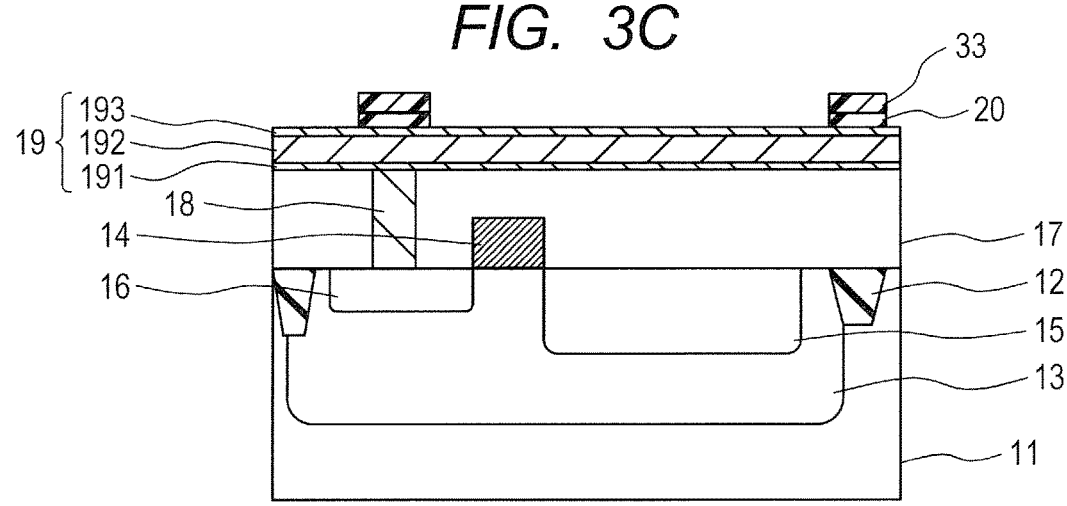

As shown in FIG. 3C, the hard mask layer 20 formed by a silicon oxide layer is dry-etched with, e.g., a $CF_4$-based gas by using the resist 33 on the hard mask layer as a mask, thereby patterning the hard mask layer 20 (FIG. 6: step S14). As this dry etching, e.g., reactive ion etching or the like can be used. Also, as the process gas of this dry etching, it is possible to use, e.g., a gas containing at least one of $CF_4$, $CHF_3$, and $C_4F_8$.

In the dry etching of the hard mask layer 20, as the dry etching of the hard mask layer 20 progresses, the titanium nitride layer of the barrier metal layer 193 immediately below the hard mask layer 20 is exposed to the process gas during this etching process. Even after the titanium nitride layer is partially exposed to the process gas, the hard mask layer 20 is overetched in order to sufficiently etch the hard mask layer 20.

In the present embodiment, in a state in which the titanium nitride layer of the barrier metal layer 193 is exposed to the process gas during the dry etching of the hard mask layer 20, process gas ratio control by which the ratio of an oxidizing gas in the process gas is set at less than 1% is performed. The ratio of an oxidizing gas in the process gas herein mentioned means the ratio of the flow rate of the oxidizing gas to the total flow rate of the process gas to be supplied to an etching chamber where dry etching is performed. Also, the oxidizing gas is a gas having oxidizability, and is, e.g., oxygen gas.

Figure 7:
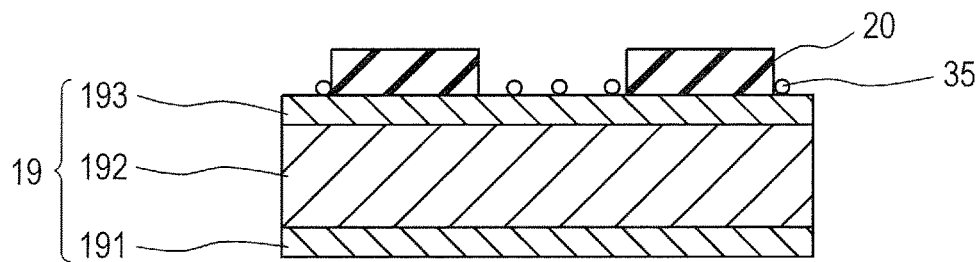
FIG. 7 is a schematic sectional view showing a reaction product after patterning of a hard mask layer.

If the ratio of the oxidizing gas in the process gas is relatively high, titanium in the exposed barrier metal layer and the oxidizing gas may react with each other and form a reaction product such as titanium oxide when patterning the hard mask layer. FIG. 7 is a schematic sectional view showing the reaction product after the hard mask layer is patterned.

As shown in FIG. 7, if the ratio of the oxidizing gas is relatively high, a reaction product 35 such as titanium oxide is formed on the exposed barrier metal layer 193 by the reaction between titanium in the barrier metal layer and the oxidizing gas when patterning the hard mask layer 20. The reaction product 35 like this decreases the etching rate of wet etching in a cleaning step after that. Note that this cleaning step is performed to remove foreign substances including the reaction product on the barrier metal layer 193 and an etching residue. If the etching rate of wet etching decreases, it becomes difficult to lift off foreign substances. As a consequence, a wiring short occurs, and the yield of a wiring step decreases.

By contrast, the semiconductor device manufacturing method according to the present embodiment decreases the ratio of the oxidizing gas in the process gas to less than 1%. This makes it possible to reduce the reaction product formed by the reaction between titanium in the titanium nitride layer of the barrier metal layer 193 and the oxidizing gas. Note that as the ratio of the oxidizing gas decreases, the effect of suppressing the formation of the reaction product increases. Note also that the effect of suppressing the occurrence of a wiring short by suppressing the reaction product becomes remarkable for a fine metal wiring which causes a wiring short even with a very small foreign substance.

The conditions of dry etching of the hard mask layer 20 in the present embodiment can appropriately be set. For example, the conditions can be set as follows.

First, in a state in which the barrier metal layer 193 immediately below the hard mask layer 20 is not exposed to the process gas, the dry etching conditions can be set as follows. That is, the internal pressure of an etching chamber can be set at 10 to 40 mTorr. Also, as the process gas to be supplied into the etching chamber, it is possible to use a gas mixture of $CF_4$, $CHF_3$, $C_4F_8$, and Ar.

Furthermore, it is possible to set the flow rate of $CF_4$ at 30 to 120 sccm, that of $CHF_3$ at 15 to 60 sccm, that of $C_4F_8$ at 5 to 20 sccm, and that of Ar at 250 to 1,000 sccm.

In a state in which etching progresses under the abovementioned conditions and the titanium nitride layer of the barrier metal layer 193 is exposed to the process gas, the conditions of dry etching performed as overetching can be set as follows. That is, the internal pressure of the etching chamber can be set at 15 to 60 mTorr. Also, as the process gas to be supplied into the etching chamber, it is possible to use a gas mixture of $C_4F_8$ and Ar. Furthermore, it is possible to set the flow rate of $C_4F_8$ at 15 to 60 sccm, and that of Ar at 500 to 2,000 sccm.

In either of the abovementioned states, no oxygen gas is supplied, and the ratio of the oxidizing gas in the process gas can be set at less than 1%. In either of the above states, it is possible to further reduce the reaction product formed by oxidation of titanium in the titanium nitride layer because no oxygen gas is supplied. Note that when the barrier metal layer 193 is not exposed to the process gas, the ratio of the oxidizing gas in the process gas need not always be set at less than 1%.

Note that the timing of changing the dry etching conditions to the overetching conditions can be determined by using an end point detector for detecting the end point of etching based on the light emission intensity in the etching chamber. That is, it is possible to monitor the light emission intensity in the etching chamber by the end point detector, and determine the timing of change to the overetching conditions based on the monitoring result.

After the hard mask layer 20 is patterned by dry etching as described above, the resist 33 used as the mask is removed by, e.g., asking (FIG. 6: step S15).

Then, cleaning is performed by using an amine-based cleaning solution, thereby partially removing the exposed upper portion of the titanium nitride layer of the barrier metal layer 193 by wet etching by the cleaning solution (FIG. 6: step S16). The amine-based cleaning solution is a cleaning solution containing amine, such as ethanol amine, triethanol amine, or hydroxyl amine, and is a neutral or alkaline cleaning solution having a pH of 7 or more. Examples of the wet etching conditions can be an etching rate of 1 to 2 Å/min, and an etching time of 15 to 60 min, more specifically, 30 min. Consequently, as shown in FIG. 4A, a patterned hard mask layer 20 is formed on the barrier metal layer 193. Note that the cleaning solution as an etching solution to be used in this wet etching is not limited to the aforementioned amine-based cleaning solution, and can properly be selected from various etching solutions by taking account of the etching rate, selectivity, and the like.

As described above, the present embodiment can reduce the reaction product formed by the reaction between titanium in the titanium nitride layer of the barrier metal layer 193 and the oxidizing gas. Therefore, it is possible to suppress the decrease in etching rate of the abovementioned wet etching, and sufficiently remove foreign substances including the reaction product on the barrier metal layer 193 and an etching residue.

Note that in the above wet etching, the etching amount of the titanium nitride layer, i.e., the etching thickness of the titanium nitride layer can preferably be set at, e.g., 50 Å or more. Accordingly, it is possible to more effectively remove foreign substances including the reaction product and an etching residue.

Subsequently, the barrier metal layer 193, conductive layer 192, and barrier metal layer 191 are sequentially dry-etched with, e.g., a $Cl_2$-based gas by using the patterned hard mask layer 20 as an etching mask (FIG. 6: step S17). As this dry etching, e.g., reactive ion etching or the like can be used. Thus, the barrier metal layer 193, the conductive layer 192, and the barrier metal layer 191 are patterned. As shown in FIG. 4B, therefore, a first metal wiring 19 is formed by a multilayered film including the barrier metal layer 191, the conductive layer 192, and the barrier metal layer 193. The side surfaces of the first metal wiring 19 are almost vertical. In this state, the selectivity between the hard mask layer 20 and the individual layers forming the first metal wiring 19 is sufficiently secured. Accordingly, there is almost no decrease in line width of the hard mask layer 20, so a fine first metal wiring 19 can be formed.

According to the present embodiment, a defect which may cause a wiring short or leak can sufficiently be suppressed even in a portion where a width d (see FIG. 2) of a space between adjacent lines in the pattern of the first metal wiring 19 is, e.g., about 0.1 to 0.2 μm.

Note that the barrier metal layers 191 and 193 obtained by sequentially stacking the titanium layer and the titanium nitride layer are used in the above explanation, but it is also possible to use barrier metal layers 191 and 193 including a titanium nitride layer without any titanium layer.

Also, to increase the orientation of the AlCu alloy layer forming the conductive layer 192 of the first metal wiring 19 in the direction of <111>, the orientation of the titanium nitride layer in the barrier metal layer 191 below the AlCu alloy layer may also be increased in the direction of <111>. Consequently, the reliability of the first metal wiring 19 including the AlCu alloy layer can be improved.

Then, an interlayer insulating layer 21 formed by a silicon oxide layer having a thickness of 500 nm is deposited by, e.g., plasma CVD on the interlayer insulating layer 17 on which the first metal wiring 19 is formed (FIG. 6: step S18). The silicon oxide layer forming the interlayer insulating layer 21 can be deposited by, e.g., causing $SiH_4$ and $O_2$ to react with each other in a plasma state at a deposition temperature of about 300° C. to 400° C.

Note that the interlayer insulating layer 21 is formed on the surface including the multilayered film of the first metal wiring 19 while the hard mask layer 20 remains on the multilayered film of the first metal wiring 19.

Subsequently, a through hole reaching the first metal wiring 19 is formed in the interlayer insulating layer 21 and hard mask layer 20. On the interlayer insulating layer 21 in which this through hole is formed, a barrier metal layer is deposited by sequentially stacking a titanium layer and titanium nitride layer by, e.g., sputtering or CVD, and a tungsten layer is deposited by, e.g., CVD. After that, the barrier metal layer and tungsten layer on the interlayer insulating layer 21 are removed by, e.g., CMP (Chemical Mechanical Polishing), thereby burying the barrier metal layer and tungsten layer in the through hole. As shown in FIG. 4C, a via plug 22 including the barrier metal layer and tungsten layer is thus buried in the through hole.

Similar to the first metal wiring 19, a second metal wiring 23 is formed on the interlayer insulating layer 21. Like the first metal wiring 19, the second metal wiring 23 can be patterned by dry etching by using a hard mask layer 24 formed by a silicon oxide layer as a mask. Also, the second metal wiring 23 can have the same arrangement as that of the first metal wiring 19. In a state in which the titanium nitride layer of a barrier metal layer 233 is exposed to the process gas when dry-etching the hard mask layer 24, process gas ratio control by which the ratio of an oxidizing gas in the process gas is set at less than 1% is performed in the same manner as above.

An interlayer insulating layer 25 formed by a silicon oxide layer having a thickness of, e.g., about 500 nm is deposited by plasma CVD or the like on the interlayer insulating layer 21 on which the second metal wiring 23 is formed. The silicon oxide layer forming the interlayer insulating layer 25 can be deposited by, e.g., causing $SiH_4$ and $O_2$ to react with each other at a deposition temperature of about 300° C. to 400° C.

Then, a through hole reaching the second metal wiring 23 is formed in the interlayer insulating layer 25 and hard mask layer 24. On the interlayer insulating layer 25 in which this through hole is formed, a barrier metal layer is deposited by sequentially stacking a titanium layer and the titanium nitride layer by, e.g., sputtering or CVD, and a tungsten layer is deposited by, e.g., CVD. The barrier metal layer and tungsten layer on the interlayer insulating layer 25 are removed by, e.g., CMP, thereby burying the barrier metal layer and the tungsten layer in the through hole. As shown in FIG. 5A, a via plug 26 including the barrier metal layer and tungsten layer is thus buried in the through hole.

Subsequently, an aluminum alloy layer made of, e.g., AlCu containing about 0.5 wt % of Cu and having a thickness of about 300 nm is deposited on the interlayer insulating layer 25 at a deposition temperature of about 300° C. by, e.g., sputtering. A mask pattern of a resist is formed on this aluminum alloy layer by photolithography. The aluminum alloy layer is dry-etched with, e.g., a $Cl_2$-based gas by using the resist mask pattern as a mask, thereby patterning the aluminum alloy layer. As this dry etching, e.g., reactive ion etching or the like can be used. A third metal wiring 27 is thus formed by the aluminum alloy layer having almost vertical side surfaces. In the third metal wiring 27 formed as described above, a minimum line width can be set at, e.g., about 0.25 to 0.3 μm.

On the interlayer insulating layer 25 on which the third metal wiring 27 is formed, an interlayer insulating layer 28 formed by a silicon oxide layer having a thickness of, e.g., about 500 nm is deposited by plasma CVD or the like. This silicon oxide layer forming the interlayer insulating layer 28 can be deposited by, e.g., causing $SiH_4$ and $O_2$ to react with each other in a plasma state at a deposition temperature of about 300° C. to 400° C.

Then, a through hole reaching the third metal wiring 27 is formed in the interlayer insulating layer 28. On the interlayer insulating layer 28 in which this through hole is formed, a barrier metal layer is deposited by sequentially stacking a titanium layer and titanium nitride layer by, e.g., sputtering or CVD, and a tungsten layer is deposited by, e.g., CVD. The barrier metal layer and tungsten layer on the interlayer insulating layer 28 are removed by, e.g., CMP, thereby burying the barrier metal layer and tungsten layer in the through hole. A via plug 29 including the barrier metal layer and tungsten layer is thus buried in the through hole.

Subsequently, an aluminum alloy layer made of, e.g., AlCu containing about 0.5 wt % of Cu and having a thickness of about 600 nm is deposited on the interlayer insulating layer 28 at a deposition temperature of about 300° C. by, e.g., sputtering. A mask pattern of a resist is formed on this aluminum alloy layer by photolithography. The aluminum alloy layer is dry-etched with, e.g., a $Cl_2$-based gas by using the resist mask pattern as a mask, thereby patterning the aluminum alloy layer. As this dry etching, e.g., reactive ion etching or the like can be used. A fourth metal wiring 30 is thus formed by the aluminum alloy layer having almost vertical side surfaces. The fourth metal wiring 30 includes a bonding pad. In the fourth metal wiring 30 formed as described above, a minimum line width can be set at, e.g., about 0.5 to 1.0 μm.

On the interlayer insulating layer 28 on which the fourth metal wiring 30 is formed, a protective insulating film 31 formed by a silicon nitride layer having a thickness of, e.g., about 500 nm is deposited by plasma CVD or the like. This silicon nitride layer forming the protective insulating film 31 can be deposited by causing a reaction of a gas containing $SiH_4$, $N_2$, and $NH_3$ in a plasma state at a deposition temperature of about 400° C. to 430° C.

After that, a mask pattern of a resist is formed on the protective insulating film 31 by photolithography. The protective insulating film 31 formed by the silicon nitride layer is dry-etched with, e.g., a $CF_4$-based gas by using the resist mask pattern as a mask. As this dry etching, e.g., reactive ion etching of the like can be used. Thus, an opening 32 for extracting an external electrode reaching the bonding pad of the fourth metal wiring 30 is formed in the protective insulating film 31.

Figure 5B:
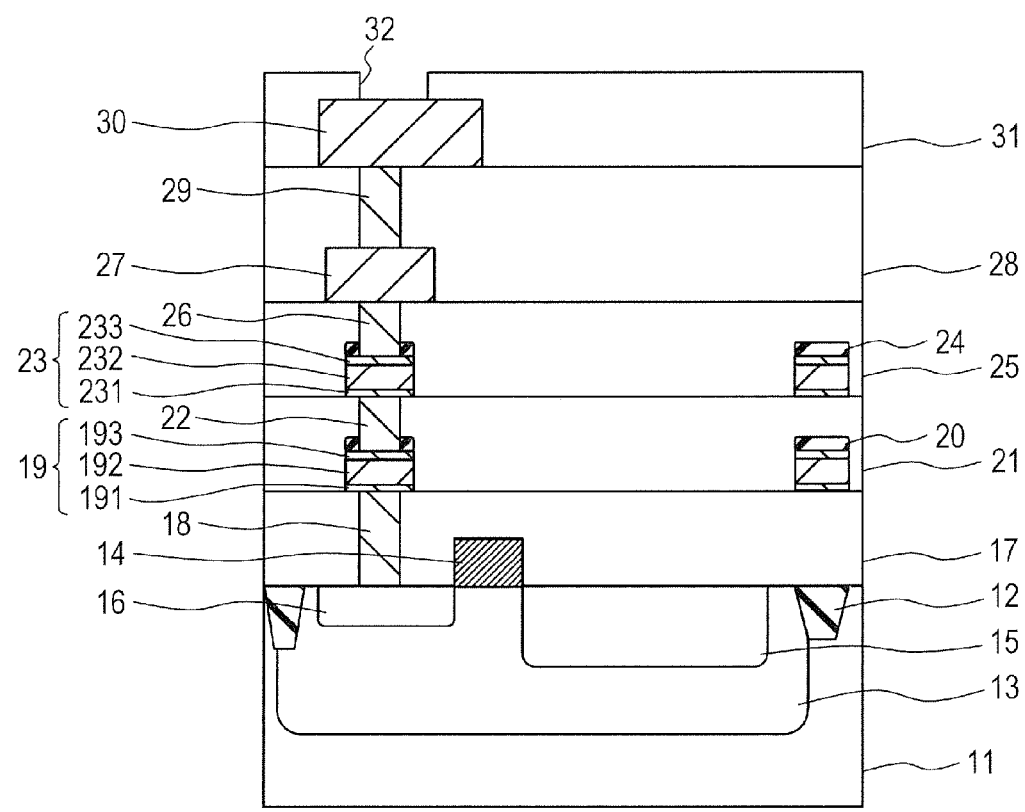
Figure 6:
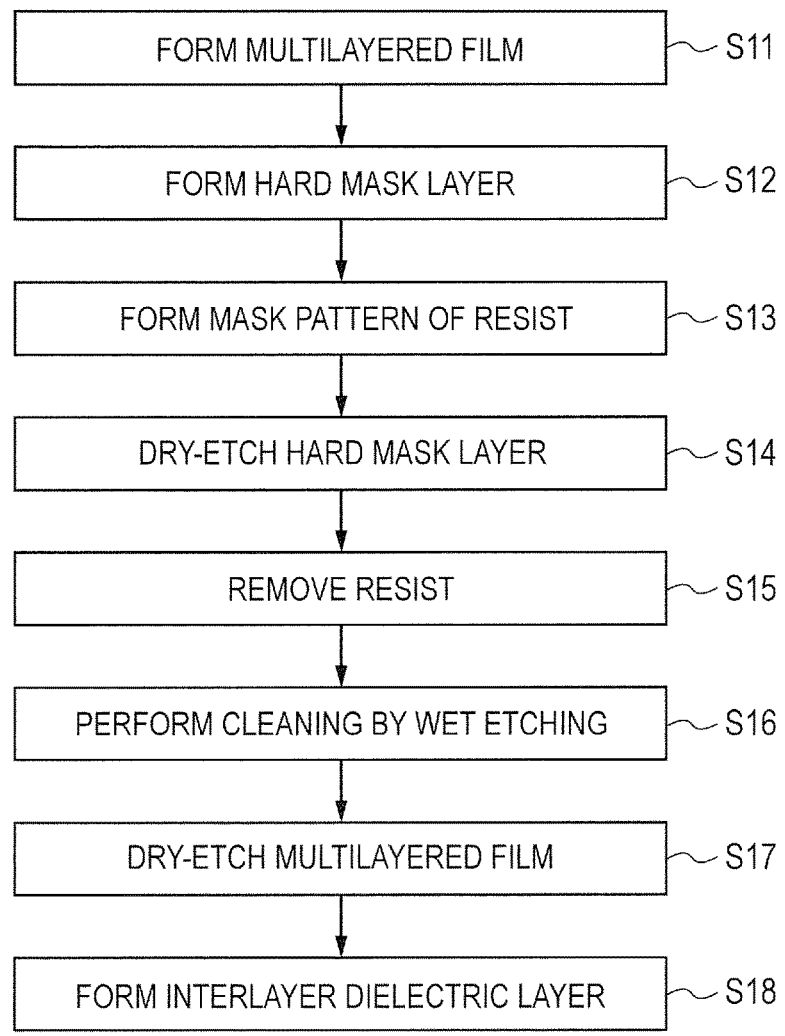
FIG. 6 is a flowchart showing a first metal wiring formation step in the semiconductor device manufacturing method according to the first embodiment of the present invention.

Thus, as shown in FIG. 5B, the semiconductor device according to the present embodiment is manufactured.

According to the present embodiment, in the state in which the titanium nitride layer of the barrier metal layer is exposed to the process gas when dry-etching the hard mask layer, the ratio of the oxidizing gas in the process gas is set at less than 1%. This makes it possible to suppress the formation of the reaction product by the reaction between titanium in the titanium nitride layer and the oxidizing gas. Consequently, in the cleaning step following dry etching of the hard mask layer, it is possible to efficiently remove a foreign substance on the titanium nitride layer by lifting it off by wet etching, and suppress the occurrence of a wiring short caused by a foreign substance. Thus, the yield of the wiring step can be improved.

As described above, the present embodiment can implement fine patterning of a metal wiring by dry etching using a hard mask layer as a mask, and suppress the occurrence of a wiring short.

Table 1 shows the relationship between the oxygen gas concentration, the presence/absence of the reaction product, and the wiring yield obtained when dry-etching the hard mask layer by experiments conducted by the present inventors. Note that the oxygen gas concentration means the ratio of the flow rate of the oxygen gas to the total flow rate of the process gas during dry etching. Table 1 reveals that when the oxygen gas concentration is set at less than 1%, the reaction product reduces, and the wiring yield improves.

TABLE 1

| Oxygen gas concentration | Above 1% | 1% | 0% |
|---|---|---|---|
| Reaction product | x (Present) | Δ (Slightly reduced) | ○ (Reduced) |
| Wiring yield | x (Bad) | Δ (Slightly improved) | ○ (Improved) |

[Second Embodiment]

A semiconductor device manufacturing method according to a second embodiment of the present invention will be explained below. Note that the same reference numerals as those of the semiconductor device and semiconductor device manufacturing method according to the aforementioned first embodiment denote the same constituent elements, and an explanation thereof will be omitted or simplified.

In the first embodiment described above, in the state in which the titanium nitride layer of the barrier metal layer is exposed to the process gas when dry-etching the hard mask layer to be used in the formation of a metal wiring, the ratio of the oxidizing gas in the process gas is set at less than 1%.

The present embodiment differs from the first embodiment in that in the state in which the titanium nitride layer of the barrier metal layer is exposed to the process gas when dry-etching the hard mask layer, the ratio of the oxidizing gas in the process gas is particularly set at 0%.

For example, when forming a hard mask layer 20 to be used in the formation of a first metal wiring 19, the hard mask layer 20 formed by a silicon oxide layer is patterned by dry-etching the hard mask layer 20 by using, e.g., a $CF_4$-based gas, in the same manner as in the first embodiment. In the present embodiment, in a state in which a titanium nitride layer of a barrier metal layer 193 is exposed to the process gas, process gas ratio control which particularly sets the ratio of the oxidizing gas at 0% is performed.

Also, when forming a hard mask layer 24 to be used in the formation of a second metal wiring 23, process gas ratio control which particularly sets the ratio of the oxidizing gas at 0% is performed in a state in which a titanium nitride layer of a barrier metal layer 233 is exposed to the process gas.

In the present embodiment as described above, the ratio of the oxidizing gas is particularly set at 0%. This makes it possible to further suppress the formation of the reaction product formed by the reaction between titanium in the titanium nitride layer and the oxidizing gas, and further suppress the occurrence of a wiring short.

[Third Embodiment]

A semiconductor device manufacturing method according to a third embodiment of the present invention will be explained below with reference to FIGS. 8 and 9. Note that the same reference numerals as those of the semiconductor device and semiconductor device manufacturing method according to the aforementioned first embodiment denote the same constituent elements, and an explanation thereof will be omitted or simplified.

The present embodiment further includes a step of cleaning the surface of an exposed barrier metal layer by two-fluid cleaning, after a wet-etching cleaning step following dry etching of a hard mask layer to be used in the formation of a metal wiring, and before dry etching of a multilayered film as the metal wiring. The present embodiment differs from the first embodiment in this point.

Figure 8:
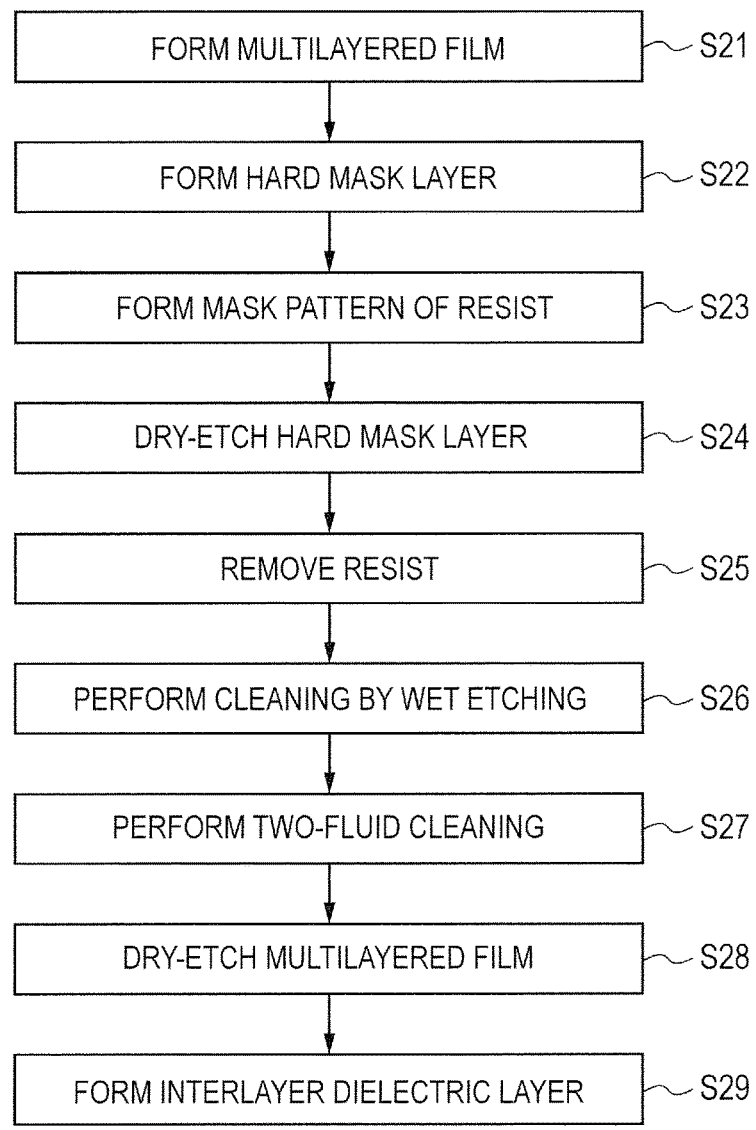
FIG. 8 is a flowchart showing a first metal wiring formation step in a semiconductor device manufacturing method according to a third embodiment of the present invention.
Figure 9:
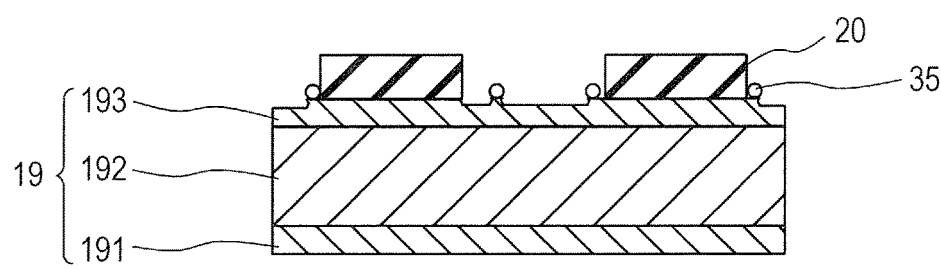
FIG. 9 is a schematic sectional view showing a state in which a reaction product is not sufficiently lifted off by wet etching.

FIG. 8 is a flowchart showing a first metal wiring formation step in the semiconductor device manufacturing method according to the present embodiment. Steps S21 to S26 shown in FIG. 8 are the same as steps S11 to S16 shown in FIG. 6 described above, respectively.

In the present embodiment also, as in the first embodiment, a hard mask layer 20 is dry-etched with, e.g., a $CF_4$-based gas (FIG. 8: step S24), and a resist 33 is removed by, e.g., asking (FIG. 8: step S25). After that, a titanium nitride layer of a barrier metal layer 193 is partially wet-etched by using, e.g., an amine-based cleaning solution (FIG. 8: step S26).

If the wet etching amount of the titanium nitride layer is small in this wet etching in step S26, it is sometimes impossible to sufficiently lift off a reaction product formed by the reaction between titanium in the titanium nitride layer and an oxidizing gas. FIG. 9 is a schematic sectional view showing a state in which the reaction product is not sufficiently lifted off by wet etching. As shown in FIG. 9, the upper portion of the titanium nitride layer of the barrier metal layer 193 is partially removed by wet etching, but a reaction product 35 sometimes remains without being lifted off.

In the present embodiment, therefore, the surface of the titanium nitride layer of the barrier metal layer 193 is cleaned by two-fluid cleaning using, e.g., pure water and nitrogen after wet etching in step S26 (FIG. 8: step S27). In this two-fluid cleaning, a two-fluid nozzle mixes a fluid such as pure water and a gas such as nitrogen and sprays the mixture in the form of fine mist against the surface of the titanium nitride layer, thereby cleaning the surface of the titanium nitride layer.

Note that the liquid and gas to be used in two-fluid cleaning are not limited to pure water and nitrogen, respectively, and can properly be selected in accordance with the necessary cleaning properties or the like. Note also that the conditions of two-fluid cleaning such as the supply flow rates of the liquid and gas and the cleaning time can properly be set in accordance with the necessary cleaning properties or the like.

As described above, two-fluid cleaning can efficiently remove foreign substances including the reaction product 35 which is not lifted off but remains because the wet etching amount of the titanium nitride layer is small in step S26. This makes it possible to suppress the occurrence of a wiring short caused by a foreign substance, and improve the yield of a wiring step.

After two-fluid cleaning is performed, the barrier metal layer 193, a conductive layer 192, and a barrier metal layer 191 are dry-etched with, e.g., a $Cl_2$-based gas by using the hard mask layer 20 as a mask, in the same manner as in step S17 described earlier (FIG. 8: step S28). A first metal wiring 19 is thus formed.

Processes from a step (FIG. 8: step S29) of forming an interlayer insulating layer 21 are the same as those in the first embodiment.

Note that when forming a hard mask layer 24 to be used in the formation of a second metal wiring 23, two-fluid cleaning can be performed after a wet-etching cleaning step and before dry etching of a multilayered film as the second metal wiring 23, in the same manner as above.

[Fourth Embodiment]

Figure 10A:
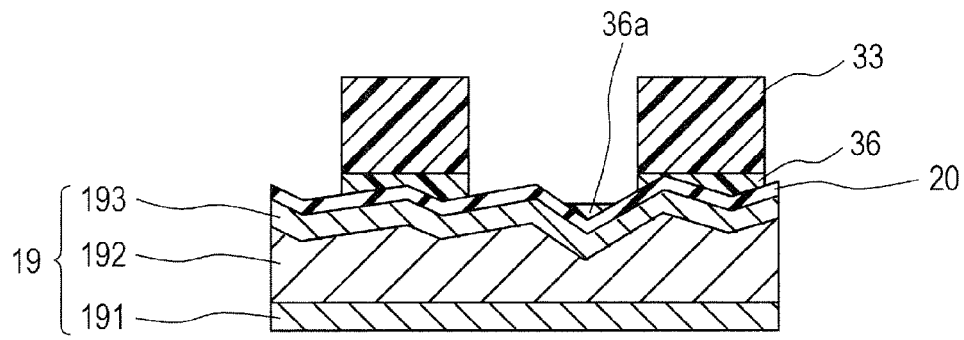
FIGS. 10A and 10B are schematic sectional views for explaining a step of removing BARC in a semiconductor device manufacturing method according to a fourth embodiment of the present invention.
Figure 10B:
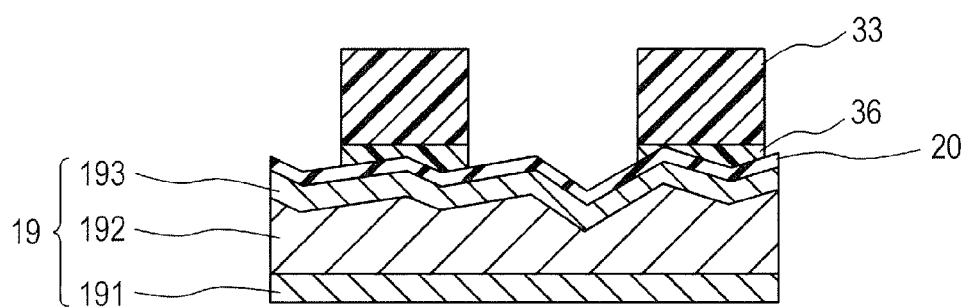

A semiconductor device manufacturing method according to a fourth embodiment of the present invention will be explained with reference to FIGS. 10A and 10B. Note that the same reference numerals as those of the semiconductor device and semiconductor device manufacturing method according to the aforementioned first embodiment denote the same constituent elements, and an explanation thereof will be omitted or simplified.

In the present embodiment, a BARC (Bottom Anti-Reflective Coating) as an anti-reflective layer is formed below a resist to be used as a mask for dry-etching a hard mask layer to be used in the formation of a metal wiring. The present embodiment differs from the first embodiment in this point. In the present embodiment using the BARC, it is possible to suppress halation of resist exposure by suppressing reflection by an underlying metal layer to be processed into a metal wiring, thereby improving the accuracy of a resist mask pattern. Accordingly, the present embodiment can improve the accuracy of a hard mask layer to be used as a mask, and implement finer wiring processing.

In addition, the present embodiment includes a step of removing the exposed BARC by dry etching after the resist mask pattern is formed, and the time of this step of removing the BARC by dry etching is so defined as to satisfy a specific condition. The BARC removing step according to the present embodiment will be explained below with reference to FIGS. 10A and 10B. FIGS. 10A and 10B are schematic sectional views for explaining the BARC removing step according to the present embodiment.

In the present embodiment, after a hard mask layer 20 is formed on a barrier metal layer 193, the hard mask layer 20 is coated with a BARC 36. Then, the BARC 36 is coated with a resist 33, and a mask pattern of the resist 33 is formed by patterning the resist 33 by photolithography. Reflection by an underlying metal layer is suppressed because the resist 33 formed on the BARC 36, i.e., an anti-reflective layer is patterned by photolithography. As a consequence, halation is suppressed when the resist 33 is exposed. Therefore, the accuracy of the mask pattern of the resist 33 can be improved.

Subsequently, the BARC 36 and the hard mask layer formed by a silicon oxide layer are dry-etched with, e.g., a $CF_4$-based gas by using the resist 33 as a mask. As this dry etching, e.g., reactive ion etching or the like can be used. In this step, the etching rate of the BARC 36 decreases if the ratio of an oxidizing gas such as oxygen gas in the process gas is set at less than 1%. Consequently, as shown in FIG. 10A, an etching residue 36a of the BARC 36 may form in a recess of the hard mask layer 20 where a thick BARC 36 is formed. The etching residue 36a of the BARC 36 acts as a mask in dry etching as a post-process, and causes a wiring short.

Accordingly, the present embodiment includes a step of removing the BARC 36 by dry etching. Letting A (nm) be the thickness of the BARC 36 and B (nm/min) be the etching rate of the BARC 36, a time C (min) of the step of removing the BARC 36 by dry etching is so set as to satisfy the following relationship:

$$C \geq (A/B) \times 1.5$$

In the present embodiment, the step of removing the BARC 36 by dry etching is thus performed for a sufficient time. As shown in FIG. 10B, therefore, it is possible to remove or reduce the etching residue 36a of the BARC 36 in the recess of the hard mask layer 20.

Note that the BARC 36 can be dry-etched by using an oxidizing gas such as oxygen gas. This makes it possible to suppress a decrease in etching rate of the BARC 36, and shorten the processing time for removing the BARC.

For example, the conditions of dry etching of the BARC 36 can be set as follows. First, the internal pressure of an etching chamber can be set at 50 to 200 mTorr. Also, a gas mixture of $CF_4$ and $O_2$ can be used as the process gas to be supplied into the etching chamber. Furthermore, the flow rate of $CF_4$ can be set at 75 to 300 sccm, and that of $O_2$ can be set at 10 to 35 sccm.

Then, in the same manner as in the first embodiment, the hard mask layer 20 formed by a silicon oxide layer is patterned by dry-etching the hard mask layer 20 with, e.g., a $CF_4$-based gas by using the resist 33 as a mask. The conditions of this dry etching of the hard mask layer 20 can be the same as those of the first embodiment. Unlike dry etching of the BARC 36, an oxidizing gas such as oxygen gas need not be used in the process gas.

Subsequently, the resist 33 and BARC 36 are removed by, e.g., asking.

After that, wet etching using, e.g., an amine-based cleaning solution is performed in the same manner as in the first embodiment. Then, in the same manner as in the first embodiment, the barrier metal layer 193, a conductive layer 192, and a barrier metal layer 191 are sequentially dry-etched with, e.g., a $Cl_2$-based gas by using the hard mask 20 as an etching mask. A first metal wiring 19 is thus formed.

Note that BARC can be used in the same manner as above when forming a hard mask layer 24 to be used in the formation of a second metal wiring 23 as well.

According to the present embodiment, the step of removing BARC by dry etching is performed for a sufficient time. This makes it possible to reduce the etching residue of BARC remaining in, e.g., a recess of a hard mask layer. In addition, the processing time for removing BARC can be shortened by using an oxidizing gas such as oxygen gas in dry etching of BARC. Therefore, even when the etching rate of BARC significantly decreases because the ratio of the oxidizing gas in the process gas is set at less than 1% during etching of the hard mask layer, it is possible to suppress the etching residue of the BARC from becoming a mask. Consequently, a risk of a wiring short can be reduced.

[Fifth Embodiment]

A semiconductor device according to a fifth embodiment of the present invention will be explained with reference to FIG. 11. Note that the same reference numerals as those of the semiconductor device and semiconductor device manufacturing method according to the aforementioned first embodiment denote the same constituent elements, and an explanation thereof will be omitted or simplified.

The present embodiment differs from the first embodiment in the relationship between the width of the lower surface of a hard mask layer and the width of the lower surface of a barrier metal layer. A structural feature concerning the hard mask layer and barrier metal layer and including the relationship between the width of the lower surface of the hard mask layer and the width of the lower surface of the barrier metal layer according to the present embodiment will be explained below.

Figure 11:
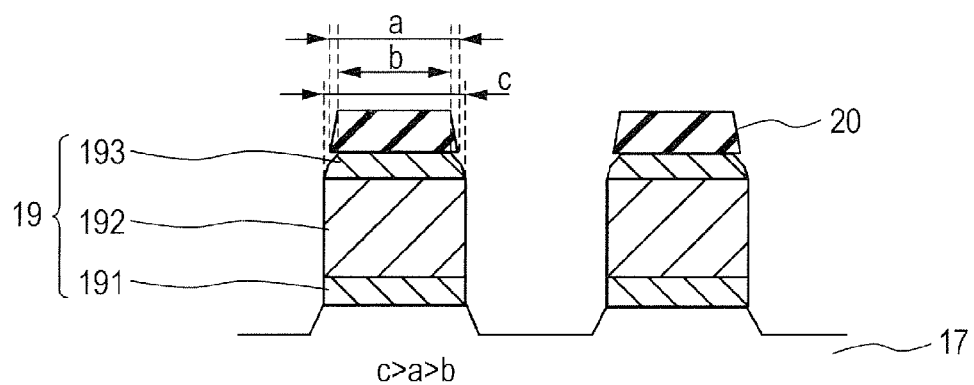
FIG. 11 is a schematic sectional view showing a metal wiring in a semiconductor device according to a fifth embodiment of the present invention.

FIG. 11 is a schematic sectional view showing a metal wiring in the semiconductor device according to the present embodiment. More specifically, FIG. 11 shows the sectional structure of a first metal wiring 19.

As shown in FIG. 11, at least the upper portion of a barrier metal layer 193 on the upper side of the first metal wiring 19 has a tapered shape which gradually widens from the upper surface toward the lower surface. At least the upper portion of a hard mask layer 20 on the barrier metal layer 193 also has a tapered shape which gradually widens from the upper surface toward the lower surface.

Let a (nm) be the width of the lower surface of the hard mask layer 20, b (nm) be the width of the upper surface of the barrier metal layer 193, and c (nm) be the width of the lower surface of the barrier metal layer 193. The hard mask layer 20 and barrier metal layer 193 have a structural feature by which the widths a, b, and c satisfy the following relationship:

$$c>a>b$$

That is, the width c of the lower surface of the barrier metal layer 193 is larger than the width a of the lower surface of the hard mask layer 20, and the width a of the lower surface of the hard mask layer 20 is larger than the width b of the upper surface of the barrier metal layer 193.

Like the structural feature shown in FIG. 2, the structural feature shown in FIG. 11 occurs when performing wet etching after dry etching for patterning the hard mask layer 20. That is, this structural feature occurs because the upper portion of the barrier metal layer 193 exposed when the hard mask layer 20 is removed is partially removed by wet etching, and the barrier metal layer 193 is side-etched. The semiconductor device according to the present embodiment can also be manufactured following the same procedures as for the semiconductor device according to the first embodiment, but the structural feature as shown in FIG. 11 is obtained by the conditions of wet etching.

[Sixth Embodiment]

Figure 12:
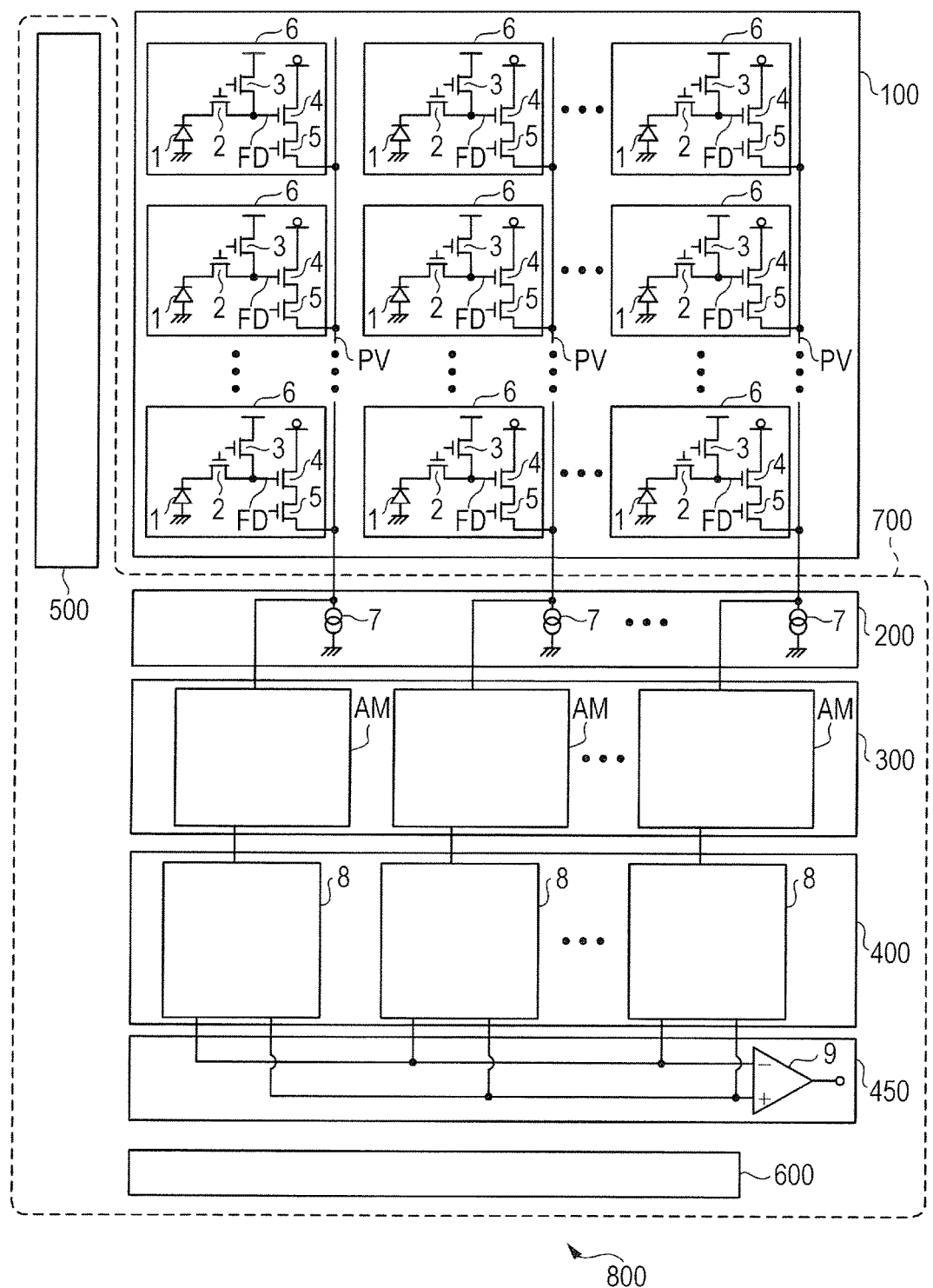
FIG. 12 is a schematic view showing a semiconductor device according to a sixth embodiment of the present invention.

A semiconductor device according to a sixth embodiment of the present invention will be explained with reference to FIG. 12. FIG. 12 is a schematic view showing the semiconductor device according to the present embodiment. In the present embodiment, the overall arrangement including a pixel array region and peripheral region of a solid-state image sensor as an example of the semiconductor device of the present invention will be explained.

As shown in FIG. 12, a solid-state image sensor 800 according to the present embodiment includes a pixel array region 100 and peripheral region 700. The pixel array region 100 is a region where a plurality of pixels are arrayed. The peripheral region 700 is a region formed in the periphery of the pixel array region 100, and is a region where a plurality of control circuits for controlling a plurality of pixels and a circuit functioning as a readout path are arranged.

In the pixel array region 100, a plurality of pixels 6 are arrayed in the row and column directions. Each pixel 6 includes a photoelectric converter 1, transfer transistor 2, charge-voltage converter FD, reset unit 3, output unit 4, and selector 5. The photoelectric converter 1 is formed by the photodiode diffusion layer 15 shown in FIG. 1. The transfer transistor 2 is a transistor including the gate electrode 14 shown in FIG. 1. The charge-voltage converter FD is a floating diffusion which is an impurity diffusion layer connected to the source/drain diffusion layer 16 shown in FIG. 1.

A plurality of control circuits are arranged in the peripheral region 700. The plurality of control circuits include a vertical scanning circuit 500 and horizontal scanning circuit 600. The plurality of control circuits also include a constant current source block 200, column amplifier block 300, holding capacitor block 400, and output amplifier block 450. The constant current block 200 includes a plurality of constant current sources 7 corresponding to a plurality of column signal lines PV connected to a plurality of columns in the pixel array region 100. The column amplifier block 300 includes a plurality of column amplifier units AM corresponding to the plurality of column signal lines PV. The holding capacitor block 400 includes a plurality of column signal holding units 8 corresponding to the plurality of column amplifier units AM. The output amplifier block 450 includes an output amplifier 9.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-002052, filed on Jan. 8, 2015, which is hereby incorporated by reference herein in its entirety.

What is claimed is:

1. A semiconductor device manufacturing method comprising:
    forming a multilayered film including a conductive layer mainly containing aluminum, and a barrier metal layer formed on the conductive layer;
    forming a hard mask layer on the barrier metal layer;
    patterning a resist on the hard mask layer;
    patterning the hard mask layer by dry-etching the hard mask layer by using the patterned resist as a mask;
    cleaning a surface of the barrier metal layer with a cleaning solution after the patterning the hard mask layer; and
    dry-etching the multilayered film by using the patterned hard mask layer as a mask after the cleaning the surface of the barrier metal layer,
    wherein in the patterning the hard mask layer, dry etching is performed by setting a ratio of a flow rate of an oxidizing gas to a total flow rate of a process gas at less than 1% in a state in which the barrier metal layer is exposed to the process gas, and wherein the ratio of the flow rate of the oxidizing gas to the total flow rate of the process gas in a state before the barrier metal layer is exposed to the process gas is higher than the ratio of the flow rate of the oxidizing gas in the state in which the barrier metal layer is exposed to the process gas.

2. The method according to claim 1, wherein in the patterning the hard mask layer, the ratio of the flow rate of the oxidizing gas to the total flow rate of the process gas is set at 0% in the state in which the barrier metal layer is exposed to the process gas.

3. The method according to claim 1, further comprising cleaning the surface of the barrier metal layer by two-fluid cleaning after the cleaning the surface of the barrier metal layer and before the dry-etching the multilayered film.

4. The method according to claim 1, wherein the oxidizing gas is oxygen gas.

5. The method according to claim 1, wherein in the cleaning the surface of the barrier metal layer with the cleaning solution, a portion of the barrier metal layer is wet-etched by the cleaning solution.

6. The method according to claim 1, further comprising:
forming an anti-reflective layer on the barrier metal layer, before the patterning the resist;
patterning the resist formed on the anti-reflective layer in the patterning the resist; and
dry-etching the anti-reflective layer after the patterning the resist and before the patterning the hard mask layer.

7. The method according to claim 6, wherein when A (nm) is a thickness of the anti-reflective layer and B (nm/min) is an etching rate of the anti-reflective layer, a time C (min) for performing the dry-etching of the anti-reflective layer satisfies $C \geq (A/B) \times 1.5$.

8. The method according to claim 6, wherein in the dry-etching the anti-reflective layer, the anti-reflective layer is dry-etched by using oxygen gas.

9. The method according to claim 1, further comprising forming an interlayer insulating layer on a surface including the multilayered film after the dry-etching the multilayered film while the hard mask layer remains on the multilayered film.

10. The method according to claim 1, wherein in the patterning the hard mask layer, the hard mask layer is dry-etched by using a gas containing at least one of $CF_4$, $CHF_3$, and $C_4F_8$ as the process gas.

* * * * *